United States Patent
Kim et al.

(10) Patent No.: US 6,686,293 B2
(45) Date of Patent: Feb. 3, 2004

(54) METHOD OF ETCHING A TRENCH IN A SILICON-CONTAINING DIELECTRIC MATERIAL

(75) Inventors: Yunsang Kim, San Jose, CA (US); Kenny L. Doan, San Jose, CA (US); Claes H. Björkman, Mountain View, CA (US); Hongqing Shan, Cupertino, CA (US)

(73) Assignee: Applied Materials, Inc, Santa Clara, CA (US)

( * ) Notice: Subject to any disclaimer, the term of this patent is extended or adjusted under 35 U.S.C. 154(b) by 0 days.

(21) Appl. No.: 10/144,570

(22) Filed: May 10, 2002

(65) Prior Publication Data

US 2003/0211750 A1 Nov. 13, 2003

(51) Int. Cl.[7] .................. H01L 21/302; H01L 21/461
(52) U.S. Cl. .................. 438/711; 438/696; 438/700; 438/714; 438/723; 216/79; 216/80
(58) Field of Search ................ 438/700, 711, 438/714, 723, 631, 634, 638, 696; 216/17, 79, 80

(56) References Cited

U.S. PATENT DOCUMENTS

| | | | | |
|---|---|---|---|---|
| 5,770,098 A | * | 6/1998 | Araki et al. | 216/67 |
| 5,968,711 A | | 10/1999 | Lee et al. | 430/313 |
| 6,046,103 A | | 4/2000 | Thei et al. | 438/624 |
| 6,046,929 A | | 4/2000 | Aoki et al. | 365/145 |
| 6,063,711 A | | 5/2000 | Chao et al. | 438/724 |
| 6,066,567 A | | 5/2000 | En et al. | 438/706 |
| 6,074,952 A | | 6/2000 | Liu et al. | 438/706 |
| 6,090,304 A | | 7/2000 | Zhu et al. | 216/79 |
| 6,090,722 A | | 7/2000 | Armacost et al. | 438/763 |
| 6,110,826 A | | 8/2000 | Lou et al. | 438/674 |
| 6,114,253 A | | 9/2000 | Jang et al. | 438/725 |
| 6,124,192 A | | 9/2000 | Jeng et al. | 438/597 |
| 6,130,167 A | | 10/2000 | Tao et al. | 438/710 |
| 6,143,665 A | * | 11/2000 | Hsieh | 438/710 |
| 6,162,583 A | | 12/2000 | Yang et al. | 430/313 |
| 6,165,881 A | | 12/2000 | Tao et al. | 438/592 |
| 6,165,898 A | | 12/2000 | Jang et al. | 438/638 |
| 6,180,515 B1 | | 1/2001 | Chuang | 438/637 |
| 6,211,035 B1 | * | 4/2001 | Moise et al. | 438/396 |
| 6,211,092 B1 | | 4/2001 | Tang et al. | 438/719 |
| 6,245,669 B1 | | 6/2001 | Fu et al. | 438/636 |
| 6,265,320 B1 | * | 7/2001 | Shi et al. | 438/725 |
| 6,340,435 B1 | | 1/2002 | Bjorkman et al. | 216/72 |
| 6,376,365 B1 | * | 4/2002 | Tsuji | 438/624 |
| 6,455,411 B1 | * | 9/2002 | Jiang et al. | 438/624 |
| 6,518,166 B1 | * | 2/2003 | Chen et al. | 438/622 |

* cited by examiner

Primary Examiner—Caridad Everhart
Assistant Examiner—Lex H. Malsawma
(74) Attorney, Agent, or Firm—Shirley L. Church; Joseph Bach; Kathi Bean

(57) ABSTRACT

Disclosed herein is a method of etching a trench in a silicon-containing dielectric material, in the absence of a trench etch-stop layer, where the silicon-containing dielectric material has a dielectric constant of about 4 or less. The method comprises exposing the dielectric material to a plasma generated from a source gas comprising a fluorine-containing etchant gas and an additive gas selected from the group consisting of carbon monoxide (CO), argon, and combinations thereof. A volumetric flow ratio of the additive gas to the fluorine-containing etchant gas is within the range of about 1.25:1 to about 20:1 (more typically, about 2.5:1 to about 20:1), depending on the particular fluorine-containing etchant gas used. The method provides good control over critical dimensions and etch profile during trench etching. Also disclosed herein is a method of forming a dual damascene structure, without the need for an intermediate etch stop layer.

46 Claims, 12 Drawing Sheets

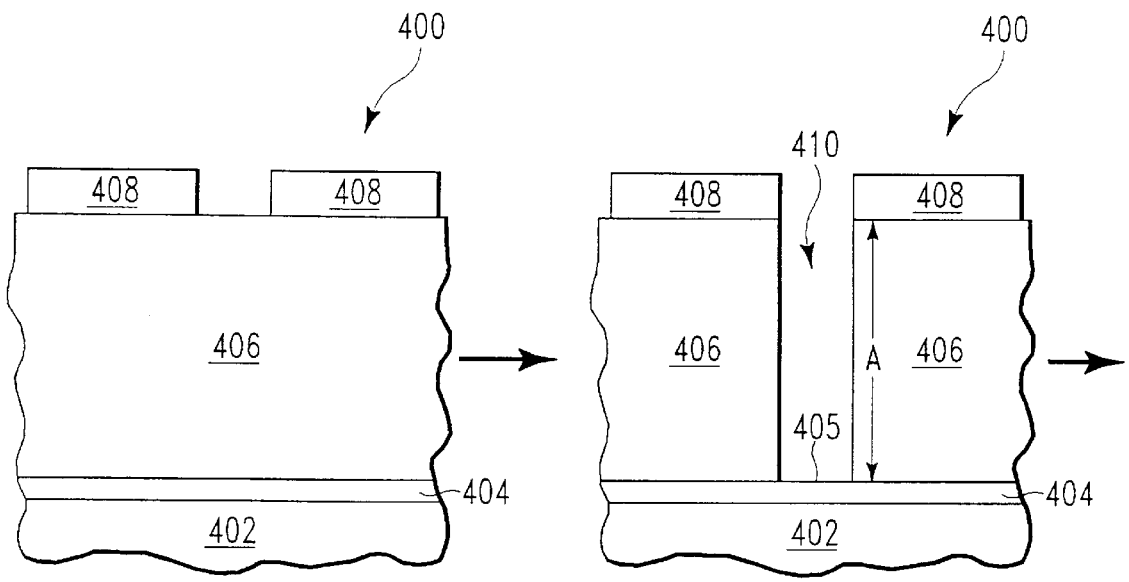
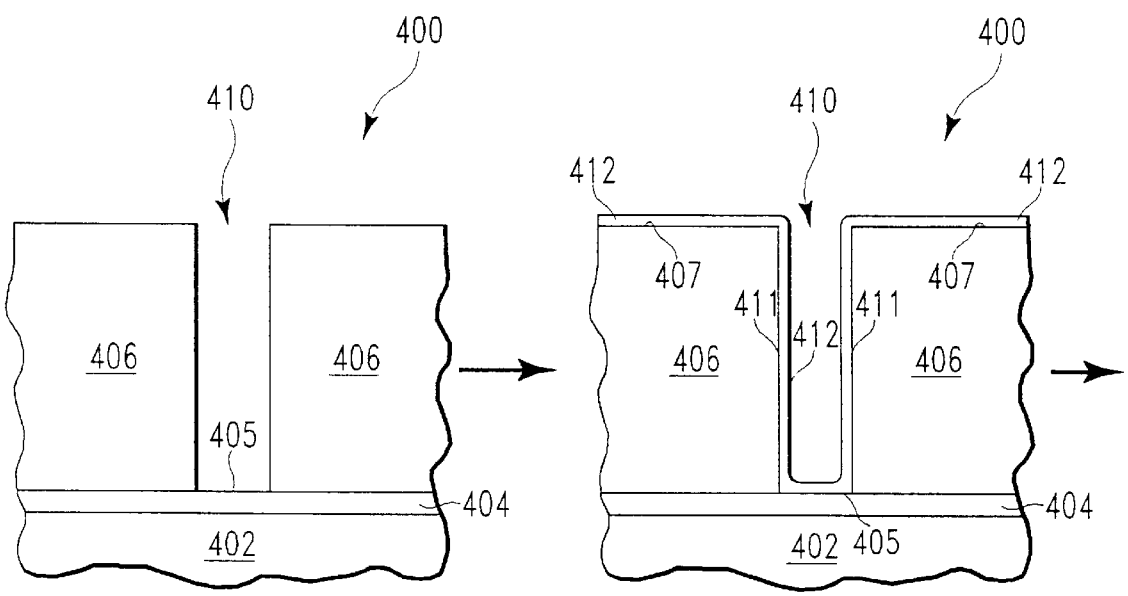
FIG. 4A (Prior Art)  FIG. 4B (Prior Art)
FIG. 4C (Prior Art)  FIG. 4D

_US 6,686,293 B2_

METHOD OF ETCHING A TRENCH IN A SILICON-CONTAINING DIELECTRIC MATERIAL

BACKGROUND OF THE INVENTION

1. Field of the Invention

The present invention pertains to a method of etching a trench in a silicon-containing material having a dielectric constant of about 4 or less. The present invention also pertains to a method of forming a dual damascene structure, without the need for an intermediate etch stop layer.

2. Brief Description of the Background Art

As device sizes decrease below 0.25 $\mu$m, the RC delay of interconnects will be the major barrier limiting the performance of ultra-large scale integrated circuits. The major components of RC delay are the capacitance of the inter-metal dielectric (IMD) and the resistance of the interconnect lines. Low dielectric constant (k) materials have been integrated with copper metallization in dual damascene structures to maximize device performance that would otherwise be degraded by capacitance between metal lines, particularly in logic devices. Since the capacitance of a device structure is determined by both the inter-level and intra-level capacitance at the interconnect, it is important to use appropriate low k materials as the IMD. To decrease device capacitance, various low k materials, such as fluorinate-silicate glass (FSG), spin-on organics, and CVD deposited or spin-on deposited organosilicate glass (OSG) have been investigated for IMD in place of traditional oxides that have dielectric constants greater than 4.

Various approaches to manufacture dual damascene devices have been studied. However, a number of challenges in the process fabrication sequence still limit the realization of mass production. Some of the most critical processes of dual damascene fabrication are the dielectric etch steps. Relatively high dielectric constant materials, such as silicon nitride (k≈7), are often deposited as etch stop layers at the via (bottom etch stop layer) and trench (intermediate etch stop layer) levels to help control the etching process.

FIGS. 2A–2G illustrate a generalized prior art procedure for forming a vertical interconnect within a dual damascene structure, where the damascene structure includes both a bottom and an intermediate etch stop layer. FIG. 2A shows a starting structure 200 for forming such a dual damascene structure. Structure 200 includes the following layers, from top to bottom, a patterned photoresist layer 212, a first IMD layer 210, an intermediate silicon nitride etch stop layer 208, a second IMD layer 206, and a bottom silicon nitride etch stop layer 204, overlying a copper interconnect layer 202. Referring to FIG. 2B, in order to form the vertical interconnect, typically a contact via, first IMD layer 210 is pattern etched, stopping on intermediate etch stop layer 208. In order to etch through intermediate etch stop layer 208, the etch chemistry (and/or processing conditions) must be changed to be more selective toward etching silicon nitride relative to the IMD, in order to avoid lateral etching into the sidewalls of overlying IMD layer 210. FIG. 2C shows structure 200 after etching of intermediate etch stop layer 208, where such lateral etching has been avoided. In order to etch through second IMD layer 206, the etch chemistry (and/or processing conditions) must be changed again to be more selective toward etching the IMD relative to silicon nitride. Referring to FIG. 2D, second IMD layer 206 is pattern etched, stopping on bottom silicon nitride etch stop layer 204, and forming intermediary structure 214. Referring to FIGS. 2E and 2F, patterned photoresist layer 212 is then removed, and a new photoresist layer 216 is deposited and patterned. Referring to FIG. 2G, a trench 215 is then pattern etched in first IMD layer 210, stopping on silicon nitride intermediate etch stop layer 208. Subsequently, as shown in FIG. 2H, a dry etch is carried out to remove bottom silicon nitride etch stop layer 204, and create a vertical interconnect 218 between copper interconnect layer 202 and an overlying metal interconnect layer (not shown) which will fill trench 215.

In addition to being cumbersome from a process integration standpoint, in terms of the large number of individual deposition and etching steps, the use of an intermediate etch stop layer in a dual damascene process can significantly increase the overall effective k value of the integrated film stack. Therefore, it would be desirable to provide a dual damascene process which does not involve the use of an intermediate etch stop layer.

FIGS. 3A–3E illustrate a generalized process for forming a vertical interconnect within a damascene structure without the use of an intermediate etch stop layer. FIG. 3A shows a starting structure 300 for forming such a dual damascene structure. Structure 300 includes the following layers, from top to bottom, a patterned photoresist layer 308, an IMD layer 306, and a bottom silicon nitride etch stop layer 304, overlying a copper interconnect layer 302. Structure 300 includes only one IMD layer and only one etch stop layer, and therefore contains two fewer layers than the starting structure 200 shown in FIG. 2A. Referring to FIG. 3B, IMD layer 306 is pattern etched to form a vertical opening 310, typically a contact via, stopping on bottom etch stop layer 304. Referring to FIGS. 3C and 3D, patterned photoresist layer 308 is then removed, and a new photoresist layer 312 is deposited and patterned. A trench 314 is then pattern etched in IMD layer 306 to a predetermined depth, using an etch chemistry such as $C_4F_6/O_2/Ar$ or $C_4F_8/CO/O_2/Ar$.

The process illustrated in FIGS. 3A–3E has two distinct advantages over the process illustrated in FIGS. 2A–2H: 1) it involves fewer deposition and etching steps and is therefore more cost effective; and 2) the final structure does not include an intermediate etch stop layer, and therefore the overall effective k value of the integrated film stack is decreased. However, as shown in FIG. 3E, the absence of an intermediate etch stop layer during etching of trench 314 typically results in moderate to severe microtrenching, creating a convex etch front with sharp corners 316 which can lead to current leakage and, ultimately, device failure.

Therefore, it would be desirable to provide a dual damascene process that does not include an intermediate etch stop layer, but allows better control over critical dimensions and etch profile during the trench etch process.

SUMMARY OF THE INVENTION

We have discovered a particular plasma etch chemistry for etching a trench in a silicon-based low k dielectric material such as a fluorinate-silicate glass (FSG) or an organosilicate glass (OSG), in the absence of a trench etch stop layer. The method which employs the plasma etch chemistry is particularly advantageous when the aspect ratio of the trench is about 6:1 or less. A silicon-based dielectric material having a patterned layer of photoresist over its upper surface is exposed to a plasma generated from a source gas comprising a fluorine-containing etchant gas and an additive gas, where the additive gas composition and the quantity of additive gas depends on the particular etchant gas and the silicon-based dielectric composition.

When faceting of the upper portion of the etched trench occurs during etching, it is helpful to use a carbon monoxide additive gas. When microloading is occurring, it is helpful to use a chemically inert additive gas which provides a good source of ions, such as argon or neon or krypton, for example. In some instances, the best results are obtained using a combination of carbon monoxide with an inert gas such as, but not limited to, argon.

When the silicon-based low k dielectric material is FSG or a similar material which contains fluorine and little to no carbon, and the etchant gas contains a high ratio of fluorine to carbon, as is the case with $CF_4$ or $C_2F_6$, so that the fluorine:carbon ratio in the etchant gas is about 3:1 or greater, it is helpful to use carbon monoxide (CO) as the additive gas. The volumetric flow ratio of the additive gas to the fluorine-containing etchant gas typically ranges from about 1.25:1 to about 20:1; more typically, from about 2.5:1 to about 20:1. When the etchant gas contains a lower ratio of fluorine to carbon, such as $C_4F_6$ or $C_4F_8$, so that the fluorine:carbon ratio of the etchant gas is less than about 3:1 (and frequently about 2:1 or less), it is beneficial to use an increased amount of CO as the additive gas, and the volumetric flow rate ratio of additive gas to etchant gas typically ranges from about 10:1 to about 20:1. Argon or other ion producing inert gas may be included in the additive gas if microloading is observed during etching. If faceting is not a problem, the portion of the additive gas which is CO may be reduced significantly, so that the percentage of the additive gas which is CO ranges from about 20% to about 50%, and in some cases the additive gas may be solely argon.

When the silicon-based low k dielectric material is OSG, or a similar material which contains carbon and little to no fluorine, and the plasma source gas from which the etchant plasma is generated includes both fluorine and carbon, faceting is typically not as problematic as it is with FSG. The additive gas used in combination with the fluorine-containing etchant gas is typically used in a quantity such that the volumetric flow ratio of the additive gas to a fluorine-containing etchant gas ranges from about 1.0 to about 4.5. Again, an inert gas may be included in the additive gas, to provide ion bombardment if microloading is problematic. In this instance the amount of inert gas added typically ranges from about 20% to about 50% of the total volumetric flow of the additive gas. In addition to the fluorine-containing etchant gas and the additive gas, nitrogen is frequently added to the plasma source gas to improve the dissociation of fluorine species and accelerate the etch rate. The amount of nitrogen added typically ranges from about 20% to about 40% of the total volumetric flow of the plasma source gas.

When the low k dielectric material being etched is FSG, and the fluorine-containing etchant gas does not contain carbon, as with $SF_6$ or $NF_3$, the additive gas should include CO, which provides selectivity for etching the FSG relative to the overlying photoresist. An inert gas such as helium, neon, argon, or krypton may be included in the additive gas to reduce microloading, in the manner described previously with respect to FSG; however, the amount of inert gas added will typically not exceed 80 volumetric % of the additive gas in this instance. The volumetric flow rate ratio of the additive gas(es) to the fluorine-containing etchant gas ranges from about 1.0 to about 4.5.

When the low k dielectric material being etched is OSG, and the fluorine containing etchant gas does not contain carbon, the amount of additive gas is typically the same as described above with reference to etching FSG; however, in addition to the additive gas, nitrogen should be added to the plasma source gas to improve the dissociation of fluorine species in the plasma and accelerate the etch rate. The amount of nitrogen added typically ranges from about 20% to about 40% by volume of the total volumetric flow of the plasma source gas.

BRIEF DESCRIPTION OF THE DRAWINGS

FIG. 2A shows a schematic of a dual damascene starting structure, including both an intermediate and a bottom etch stop layer.

FIG. 2B shows the structure of FIG. 2A after a first etch step, through a first intermetal dielectric layer, stopping at the intermediate etch stop layer.

FIG. 2C shows the structure of FIG. 2B after the etched pattern has been transferred through the intermediate etch stop layer using a second etch step.

FIG. 2D shows the structure of FIG. 2C after a third etch step, through a second intermetal dielectric layer, stopping at the bottom etch stop layer.

FIG. 2E shows the structure of FIG. 2D after the patterning mask used during the first three etch steps has been removed.

FIG. 2F shows the structure of FIG. 2E after the deposition of a new patterning mask to the upper surface of the structure.

FIG. 2G shows the structure of FIG. 2F after a forth etch step in which a trench pattern is etched into the first intermetal dielectric layer, stopping at the intermediate etch stop layer.

FIG. 2H shows the structure of FIG. 2G after the pattern in the second intermetal dielectric layer has been transferred through the bottom etch stop layer using a fifth etch step.

FIG. 3A shows a schematic of a dual damascene starting structure, where there is a single intermetal dielectric layer overlying a bottom etch stop layer.

FIG. 3B shows the structure of FIG. 3A after a first etch step, through the layer of intermetal dielectric, stopping at the bottom etch stop layer.

FIG. 3C shows the structure of FIG. 3B after the patterning mask used during the first etch step has been removed.

FIG. 3D shows the structure of FIG. 3C after the deposition of a new patterning mask to the upper surface of the structure.

FIG. 3E shows the structure of FIG. 3D after a second etch step in which a trench pattern is etched into an upper portion of the first intermetal dielectric layer.

FIGS. 4A–4H illustrate one exemplary method of the invention for forming a vertical interconnect between two conductive layers within a damascene structure, where the damascene structure does not make use of an intermediate etch stop layer.

FIG. 4A shows a schematic of a dual damascene starting structure, where there is a single intermetal dielectric layer overlying a bottom etch stop layer.

FIG. 4B shows the structure of FIG. 4A after a first etch step, through the layer of intermetal dielectric, stopping at the bottom etch stop layer.

FIG. 4C shows the structure of FIG. 4B after the patterning mask used during the first etch step has been removed.

FIG. 4D shows the structure of FIG. 4C after the deposition of a conformal layer of a protective material.

FIG. 4E shows the structure of FIG. 4D after application and development of a patterned photoresist layer on the upper surface of the structure.

FIG. 4F shows the structure of FIG. 4E after a second etch step in which a trench pattern is etched into the intermetal dielectric layer.

FIG. 4G shows the structure of 4 F after removal of the photoresist layer and the conformal protective layer from the surface of the structure.

FIG. 4H shows the final structure, after an etch step has been carried out to remove the etch stop layer at the bottom of the vertical interconnect.

DETAILED DESCRIPTION OF EXEMPLARY EMBODIMENTS

Disclosed herein is a method of method of etching a trench in a silicon-containing dielectric material having a dielectric constant of about 4 or less. The method is described in detail below with respect to a process integration scheme for forming a dual damascene structure, without the need for an intermediate etch stop layer. Exemplary processing conditions for etching the trench and forming the dual damascene structure are set forth below.

As a preface to the detailed description, it should be noted that, as used in this specification and the appended claims, the singular forms "a", "an", and "the" include plural referents, unless the context clearly dictates otherwise.

I. AN APPARATUS FOR PRACTICING THE INVENTION

Figure 1:
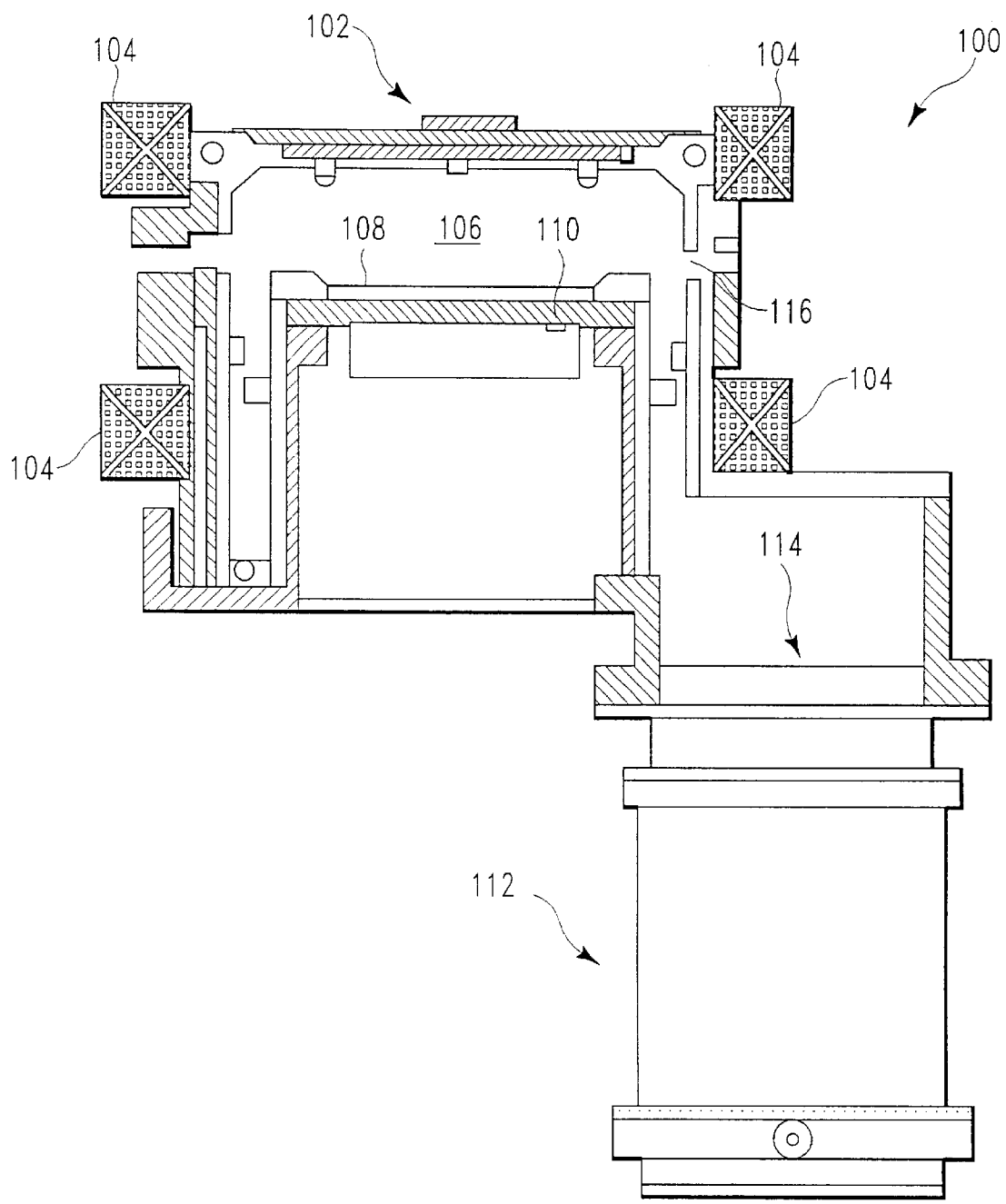
FIG. 1 shows a schematic of a capacitively coupled, magnetically enhanced reactive ion etch (MERIE) plasma reactor 100 of the kind which can be used to carry out the processes described herein.
Figures 2A, 2B:
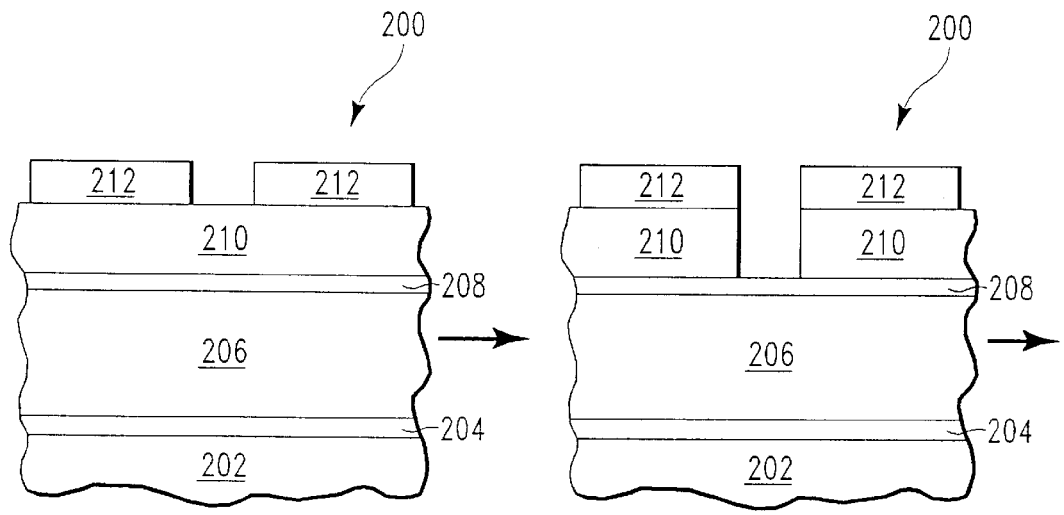
FIGS. 2A–2H illustrate a series of prior art process steps for forming a vertical interconnect between two conductive layers within a dual damascene structure, where the damascene structure has both a bottom etch stop layer and an intermediate etch stop layer
Figures 2C, 2D:
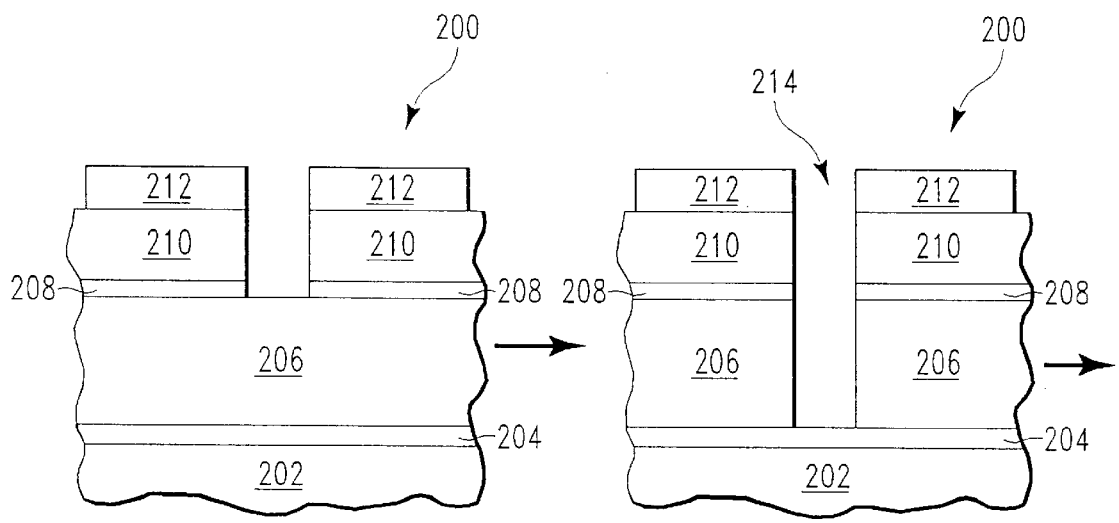
Figures 2E, 2F:
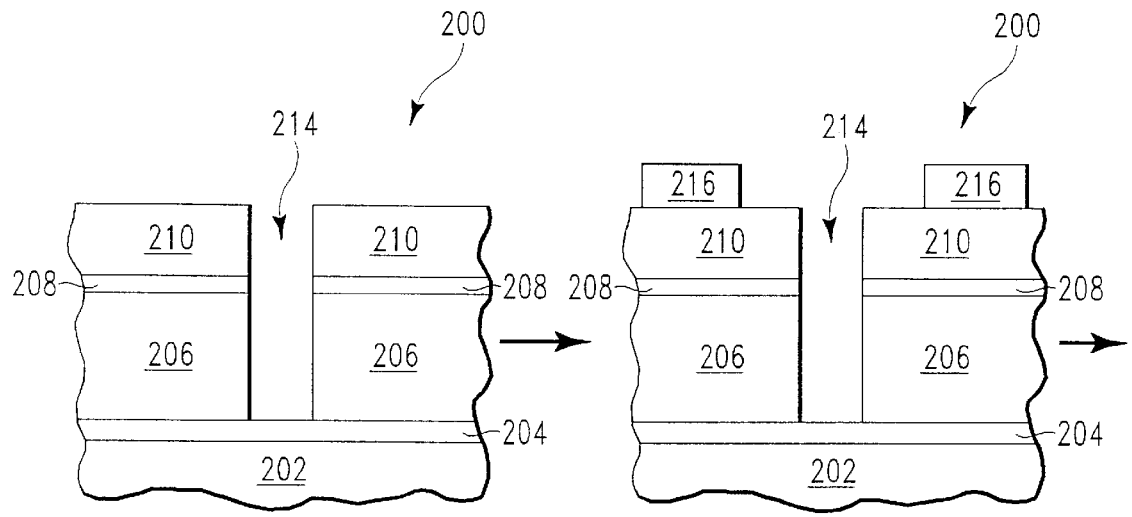
Figures 2G, 2H:
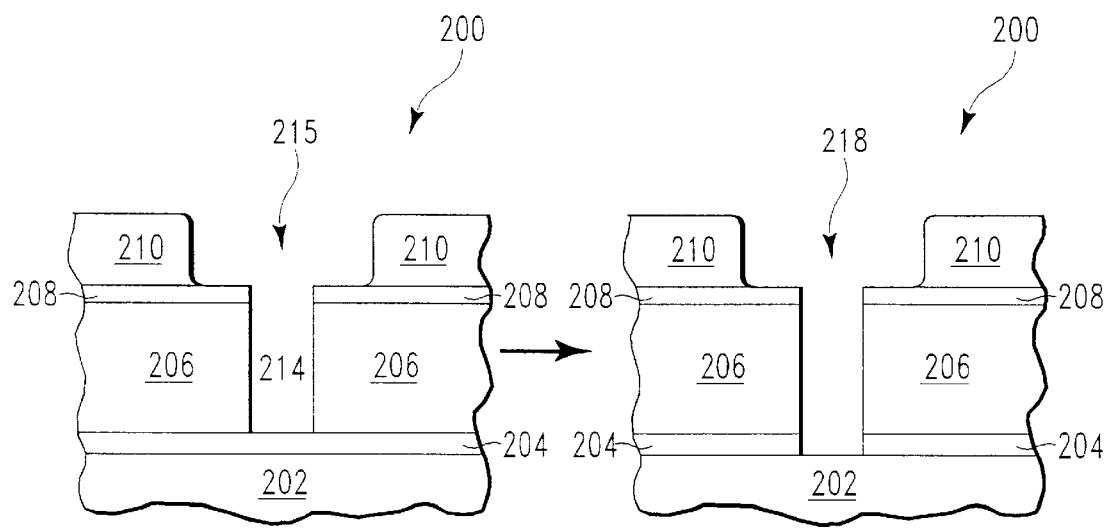

The embodiment example etch processes described herein were carried out in a capacitively coupled, magnetically enhanced reactive ion etch (MERIE) plasma reactor 100, which is shown schematically in FIG. 1. Four electromagnetic coils 104, located at the four corners of the chamber 102, generate a magnetic field of the appropriate strength in the plasma generation region 106 and allow the operator to control the field shape and the plasma density. Typically, the magnetic field strength is 0 to 100 G, resulting in a medium density plasma. The substrate to be processed is electrostatically held on a water-cooled electrostatic chuck 108 that is connected to an RF power supply through a matching network (not shown). The 13.56 MHz RF power supply (not shown) is coupled to a substrate electrode 110 to extract ions from the plasma with magnetic enhancement. The chamber 102 is pumped by a turbomolecular pump 112, and a throttle valve 114 is used to servo pressures from 100 to 500 mTorr. Ion densities of greater than $10^{10}$ $e^-/cm^3$ have been measured in a variety of discharge chemistries using a Langmuir probe. The relative density of $CF_3$ radicals in a $C_2F_6$/Ar plasma was measured by optical emission spectroscopy (OES), normalized to either an argon (750 nm) actinometer or to the plasma density. The window 116 for OES is located on the bottom of the process chamber wall, approximately 2 cm above the wafer surface.

The present method can be performed in any of the commercially available MERIE or reactive ion etch (RIE) plasma reactors. In particular, the present method can be performed in a dual frequency RIE plasma reactor, such as the Applied Materials' e MAX™ reactor, DPS™ processing chambers, and other similar plasma processing chambers known in the art.

II. EXEMPLARY METHOD OF FORMING A DUAL DAMASCENE STRUCTURE

Figures 4E, 4F:
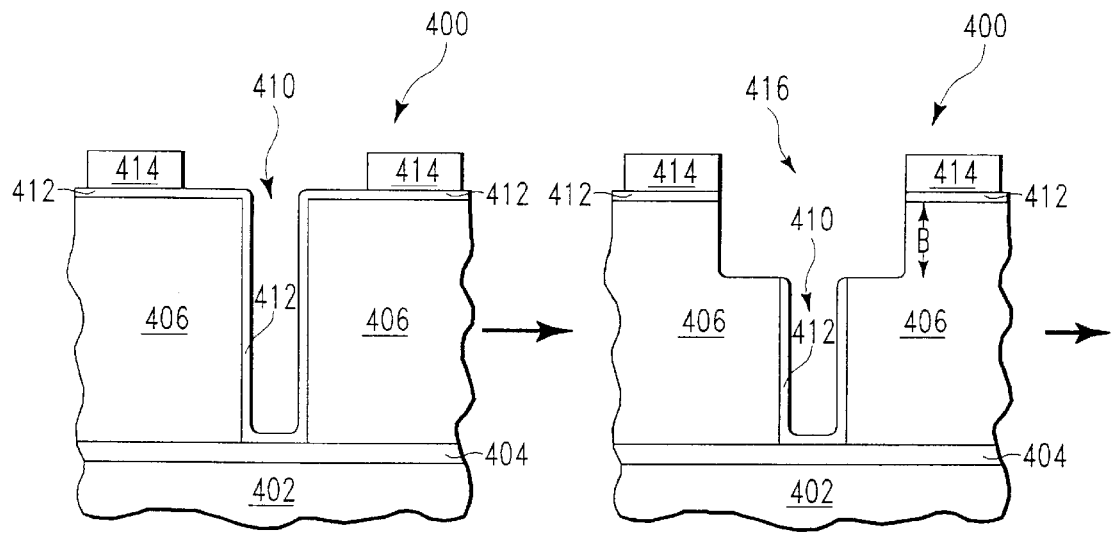

FIGS. 4A–4G illustrate an exemplary method for forming a dual damascene structure without an intermediate etch stop layer. FIG. 4A shows a starting structure 400 for forming such a dual damascene structure. Structure 400 includes the following layers, from bottom to top, a metallic interconnect layer 402, a bottom etch stop layer 404, a silicon-containing intermetal dielectric (IMD) layer 406, and a patterned photoresist layer 408. The various layers of structure 400 can be deposited using conventional deposition techniques known in the art.

Metallic interconnect layer 402 typically comprises copper. As used herein, the term "copper" includes pure copper, as well as copper containing minor amounts of additive components.

The bottom etch stop layer material is selected such that overlying IMD layer 406 can be selectively etched relative to bottom etch stop layer 404. For example, bottom etch stop layer 404 typically comprises silicon nitride, but can alternatively comprise silicon carbide (SiC) or silicon carbide nitride (SiCN). The bottom etch stop layer 404 is typically deposited by plasma-enhanced chemical vapor deposition (PECVD) to have a thickness within the range of about 500 Å to about 1000 Å.

IMD layer 406 preferably comprises a silicon-containing material having a dielectric constant (k) of about 4 or less. The IMD layer 406 may comprise, for example, silicon dioxide (k≈4.0) or a low k dielectric material. The term "low k dielectric" refers to any material having a k value lower than that of silicon dioxide. Examples of low k dielectrics useful in the method of the invention include fluorinate-silicate glass (FSG) and various types of organosilicate glass (OSG), such as, for example and not by way of limitation, Black Diamond™ (available from Applied Materials, Inc., Santa Clara, Calif.); CORAL™ (available from Novellus Systems, Inc., San Jose, Calif.); and AURORA™ (available from ASM International N.V., Bilthoven, The Netherlands). IMD layer 406 is typically deposited by PECVD to have a thickness within the range of about 5000 Å to about 10,000 Å.

Photoresist layer 408 may be any suitable photoresist material known in the art. Typically, the photoresist is an organic, carbon-containing material. Frequently, a deep ultra-violet (DUV) photoresist is used to transfer a pattern to a substrate. A typical film thickness for such a DUV photoresist ranges from about 4000 Å to about 6000 Å. DUV photoresists are available from either JSR® or SHIPLEY®, INC., for example, and not by way of limitation. The thickness and patterning method for the photoresist layer 408 will depend on the particular photoresist material used and the pattern to be imaged in the photoresist.

Referring to FIG. 4B, IMD layer 406 is pattern etched to a first predetermined depth A to form a vertical opening 410 (typically a contact via), stopping on and exposing an upper surface 405 of bottom etch stop layer 404. The plasma etch chemistry and process conditions used during etching of vertical opening 410 preferably provide a selectivity for etching IMD layer 406 relative to bottom etch stop layer 404 of at least 10:1. As used herein, the term "selectivity" or "etch selectivity" refers to a ratio of the etch rate of a first material (e.g., IMD layer 406) to the etch rate of a second material (e.g., bottom etch stop layer 404) using a given plasma source gas and processing conditions.

When the IMD layer 406 comprises FSG or OSG, and the etch stop layer 404 comprises silicon nitride, the following plasma source gas and process conditions provide good results during etching of vertical opening 410: a plasma source gas including 30 sccm of $C_4F_6$, 20 sccm of $O_2$ and 300 sccm of Ar, a substrate electrode power of 1500 W, a process chamber pressure of about 40 mTorr, and a substrate temperature of about 15° C.

Residual photoresist layer 408 remaining after etching of vertical opening 410 is then removed. FIG. 4C shows structure 400 after removal of photoresist layer 408.

Referring to FIG. 4D, a conformal layer 412 of a protective material is now deposited over the field surface 407 of IMD layer 406, sidewalls 411 of vertical opening 410, and the exposed surface 405 of bottom etch stop layer 404. The purpose of protective layer 412 is to enable the use of proper etch conditions for etching a trench (416) in IND 406 while protecting bottom etch stop layer 404, in the subsequent etch step shown in FIG. 4F. Protective layer 412 is typically an antireflective coating (ARC) material, which provides the added function of reducing standing waves and back-scattered light, so that the dimensions of the patterning in a subsequently deposited photoresist layer can be better controlled. Examples of ARC materials useful in the method of the invention include silicon oxynitride and organic ARC materials known in the art, by way of example and not by way of limitation.

The conformal protective layer 412 is typically deposited to have a thickness within the range of about 800 Å to about 1200 Å on the field surface 407 of IMD layer 406; about 500 Å to about 800 Å on the sidewalls 411 of vertical opening 410; and about 6,000 Å to about 8,000 Å on the exposed surface 405 of bottom etch stop layer 404. The thickness and deposition method for conformal protective layer 412 will depend on the particular ARC material used.

Referring to FIG. 4E, a second layer 414 of photoresist is then deposited and patterned using techniques known in the art (as described above with respect to the deposition and patterning of first photoresist layer 408) to form the pattern for subsequent trench etching.

Referring to FIG. 4F, a trench 416 is then etched in IMD layer 406 to a second predetermined depth B using photoresist layer 414 as a patterning mask. Second predetermined depth B (the height of trench 416) is less than first predetermined depth A (the original height of vertical opening 410, shown in FIG. 4B).

Trench etching is performed using a plasma generated from a source gas comprising a fluorine-containing etchant gas and an additive gas. The additive gas composition and quantity of additive gas depends on the particular etchant gas and the silicon-based dielectric composition. The additive gas is typically carbon monoxide (CO) and/or argon. The use of carbon monoxide as the additive gas provides better selectivity for etching the dielectric material relative to the overlying photoresist than does argon. Argon provides a selectivity for etching the dielectric material relative to the photoresist of about 1.5:1, whereas carbon monoxide provides an etch selectivity within the range of about 2:1 to about 3:1. In order to provide optimum trench etch results, carbon monoxide and argon may be used in combination. When a combination of CO and argon is used, the volumetric flow ratio of CO to argon is typically within the range of about 1:10 to about 10:1, and more typically within the range of about 1:1 to about 2:1.

When faceting of the upper portion of the etched trench occurs during etching, it is helpful to use a carbon monoxide additive gas. When microloading is occurring, it is helpful to use a chemically inert additive gas which provides a good source of ions, such as argon or neon or krypton, for example. In some instances, the best results are obtained using a combination of carbon monoxide with an inert gas such as, but not limited to, argon.

When the silicon-based low k dielectric material is FSG or a similar material which contains fluorine and little to no carbon, and the etchant gas contains a high ratio of fluorine to carbon, as is the case with $CF_4$ or $C_2F_6$, so that the fluorine:carbon ratio in the etchant gas is about 3:1 or greater, it is helpful to use carbon monoxide (CO) as the additive gas. The volumetric flow ratio of the additive gas to the fluorine-containing etchant gas typically ranges from about 1.25:1 to about 20:1; more typically, from about 2.5:1 to about 20:1. When the etchant gas contains a lower ratio of fluorine to carbon, such as $C_4F_6$ or $C_4F_8$, so that the fluorine :carbon ratio of the etchant gas is less than about 3:1 (and frequently about 2:1 or less), it is beneficial to use an increased amount of CO as the additive gas, and the volumetric flow rate ratio of additive gas to etchant gas typically ranges from about 10:1 to about 20:1. Argon or other ion producing inert gas may be added in either case if microloading is observed during etching. If faceting is not a problem, the portion of the additive gas which is CO may be reduced significantly, so that the percentage of the additive gas which is CO ranges from about 20% to about 50%, and in some cases the additive gas may be solely argon.

In one embodiment of trench etching, where the substrate was FSG, we found that fluorine-rich fluorocarbons having a fluorine:carbon ratio of at least about 3:1, such as $CF_4$ and $C_2F_6$, can be used in combination with an additive gas to provide excellent etched trench. A volumetric flow rate ratio of the additive gas to the fluorocarbon gas was within the range of about 2.5:1 to about 5:1. The additive gas was a combination of CO and argon, where the CO volumetric % of the additive gas ranged from about 20% to about 50%.

In instances where the fluorine-containing etchant gas does not contain carbon, as with $SF_6$ or $NF_3$, and the low k dielectric material is FSG, the additive gas should include CO, which provides selectivity for etching the FSG relative to the overlying photoresist. In addition, an inert gas such as helium, neon, argon, or krypton may be added to the plasma source gas. Typically, the volumetric flow rate ratio of the additive gas(es) to the fluorine-containing etchant gas ranges from about 1.5 to about 10. In some instances, the additive gas is solely CO.

When the silicon-based low k dielectric material is OSG, or a similar material which contains carbon and little to no fluorine, and the etchant gas contains a high ratio of fluorine to carbon, where the ratio of fluorine to carbon is about 3:1 or greater, a carbon monoxide additive gas is typically used in a quantity such that the volumetric flow ratio of the additive gas to the fluorine-containing etchant gas ranges from about 1:1 to about 3:1. When the fluorine to carbon ratio is less than about 3:1, the volumetric flow ratio of the carbon monoxide additive gas to the fluornre-containing etchant gas ranges from about 5:1 to about 10:1. Again, an inert gas may be added to provide ion bombardment if microloading is problematic. When the silicon-based low k dielectric material is an organic material, the etchant gas typically also includes $N_2$ to aid in the dissociation of the fluorine-containing gas and increase the etch rate of the carbon-containing dielectric material. The volumetric flow ratio of the fluorine-containing gas to the $N_2$ is typically within the range of about 3:1 to about 1:1.

When the fluorine-containing etchant is $SF_6$ or $NF_3$, and the low k dielectric material is OSG, the additive gas typically includes carbon monoxide, where the volumetric flow rate ratio of carbon monoxide to etchant gas in the plasma source gas ranges from about 1:1 to about 3:1. An inert gas may be added in an amount such that the volumetric flow ratio of inert gas to etchant gas ranges from about 1:1 to about 5:1. Further, nitrogen may be added in a quantity which ranges from about 20% to about 40% of the total volumetric flow of plasma source gas.

Table One, below, provides process conditions for etching a trench in an inorganic IMD layer (such as silicon oxide or FSG) according to the method of the invention.

TABLE ONE

Process Conditions for Plasma Etching of a Trench in an Inorganic Intermetal Dielectric Layer

| Process Parameter | Range of Process Conditions | More Preferred Process Conditions | Optimum Known Process Conditions*** |
|---|---|---|---|
| Etchant Gas* Flow Rate (sccm) | 20–80 | 50–75 | 60–70 |
| Additive Gas** Flow Rate (sccm) | 100–400 | 100–300 | 200–300 |
| Total Gas Flow Rate (sccm) | 120–500 | 150–400 | 250–400 |
| Substrate Electrode Power (W) | 800–2000 | 1000–2000 | 1000–2000 |
| Process Chamber Pressure (mTorr) | 150–600 | 200–500 | 200–400 |
| Substrate Temperature (° C.) | 15–70 | 15–40 | 15–40 |
| Ion Density ($e^-/cm^3$) | $10^9$–$10^{10}$ | $10^9$–$10^{10}$ | $10^9$–$10^{10}$ |

*$CF_4$, $C_2F_6$, $C_4F_6$, $SF_6$, $NF_3$, or a combination thereof.
**CO, argon, or a combination thereof. When the etchant gas is $SF_6$ or $NF_3$, and at least 20% of the additive gas must be CO.
***For $CF_4$ or $C_2F_6$ etchant gas.

Table Two, below, provides process conditions for etching a trench in an organic IMD layer according to the method of the invention.

TABLE TWO

Process Conditions for Plasma Etching of a Trench in an Organic Intermetal Dielectric Layer

| Process Parameter | Range of Process Conditions | More Preferred Process Conditions | Optimum Known Process Conditions*** |
|---|---|---|---|
| Etchant Gas* Flow Rate (sccm) | 50–200 | 60–120 | 60–120 |
| Additive Gas** Flow Rate (sccm) | 50–400 | 50–200 | 50–200 |
| $N_2$ Flow Rate (sccm) | 30–100 | 40–80 | 40–80 |
| Total Gas Flow Rate (sccm) | 130–700 | 150–400 | 150–400 |
| Substrate Electrode Power (W) | 600–1500 | 600–1200 | 600–1000 |
| Process Chamber Pressure (mTorr) | 100–400 | 150–300 | 150–300 |
| Substrate Temperature (° C.) | 15–50 | 15–35 | 15–35 |
| Ion Density ($e^-/cm^3$) | $10^9$–$10^{10}$ | $10^9$–$10^{10}$ | $10^9$–$10^{10}$ |

*$CF_4$, $C_2F_6$, $C_4F_6$, $SF_6$, $NF_3$, or a combination thereof.
**CO, argon, or a combination thereof. When the etchant gas is $SF_6$ or $NF_3$, and at least 20% of the additive gas must be CO.
***For $CF_4$ or $C_2F_6$ etchant gas.

After etching of trench 416 in silicon-containing dielectric layer 406, residual photoresist 414 and protective layer 412 remaining after trench etching are typically removed. If the protective layer comprises a carbon-containing material, the protective layer 412 can typically be removed in a single step along with the residual photoresist 414. Residual photoresist 414 and carbon-containing protective layer 412 are typically removed by ashing. For example, residual photoresist 414 and protective layer 412 can be removed by plasma ashing in situ (i.e., in the same process chamber in which trench etching was performed) using pure $O_2$, or a combination of $O_2$ and $N_2$ (where $N_2$ less than 50 volume % of the $O_2/N_2$), for a period of about 1 minute, at the same substrate temperature used during trench etching.

Figures 3A, 3B:
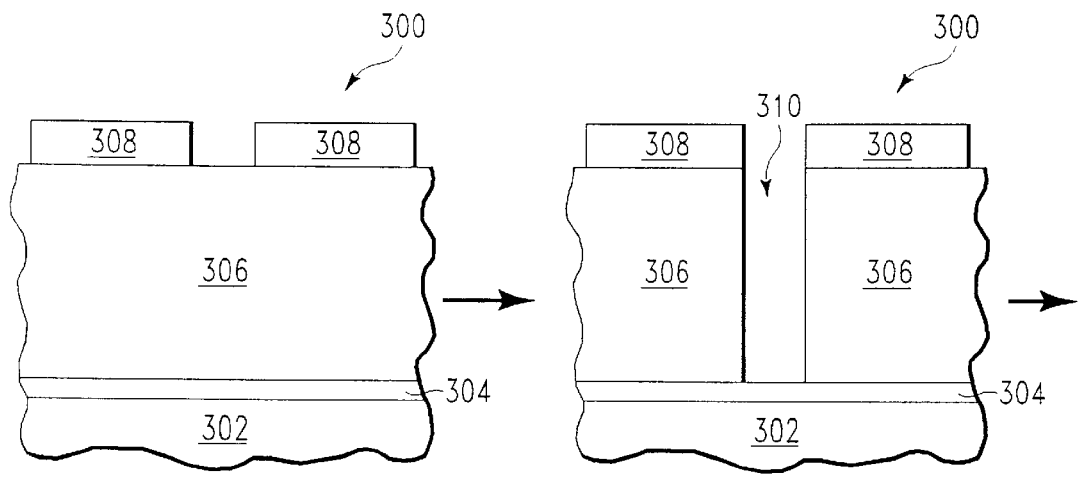
FIGS. 3A–3E illustrate a prior art process for forming a vertical interconnect between two conductive layers within a damascene structure, where the damascene structure does not make use of an intermediate etch stop layer.
Figures 3C, 3D:
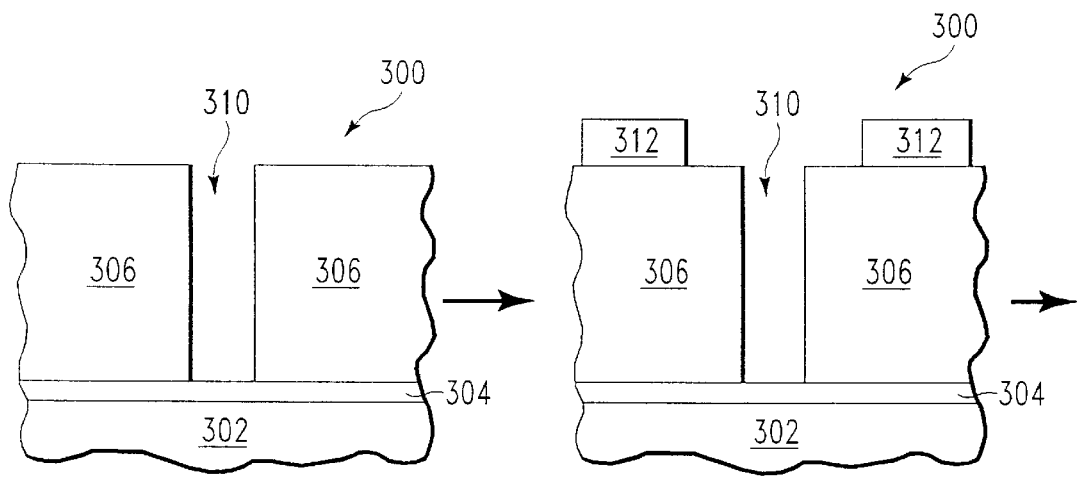
Figure 3E:
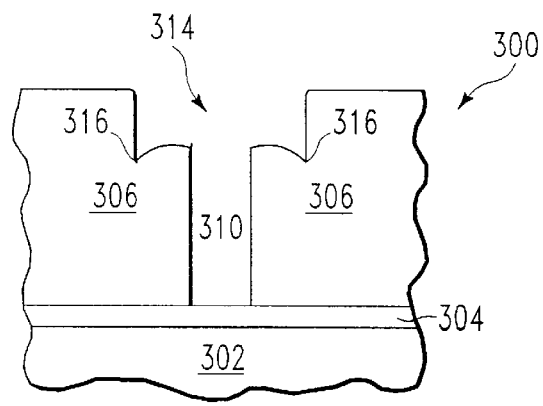
Figures 4G, 4H:
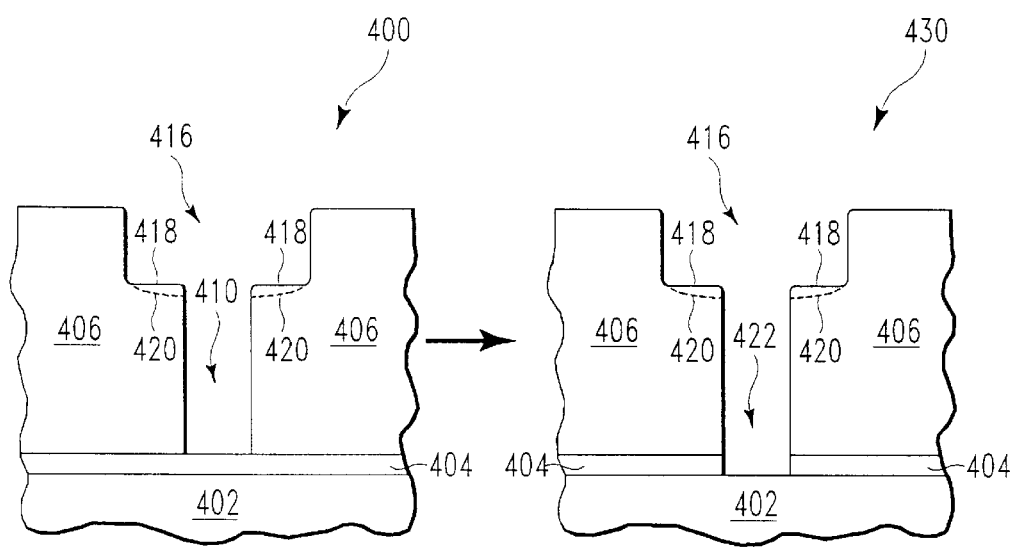

The final structure 430 after removal of photoresist 414 and protective layer 412 is shown in FIG. 4G. Note that the etch chemistry of the invention provides a flat etch front 418 or concave etch front 420 (indicated by the dotted line) with rounded corners, as opposed to the convex etch front with sharp corners 316 illustrated in FIG. 3E, which was obtained using a prior art dielectric etch chemistry (such as $C_4F_6/O_2/Ar$ or $C_4F_8/CO/O_2/Ar$).

III. EXAMPLES

Figure 5:
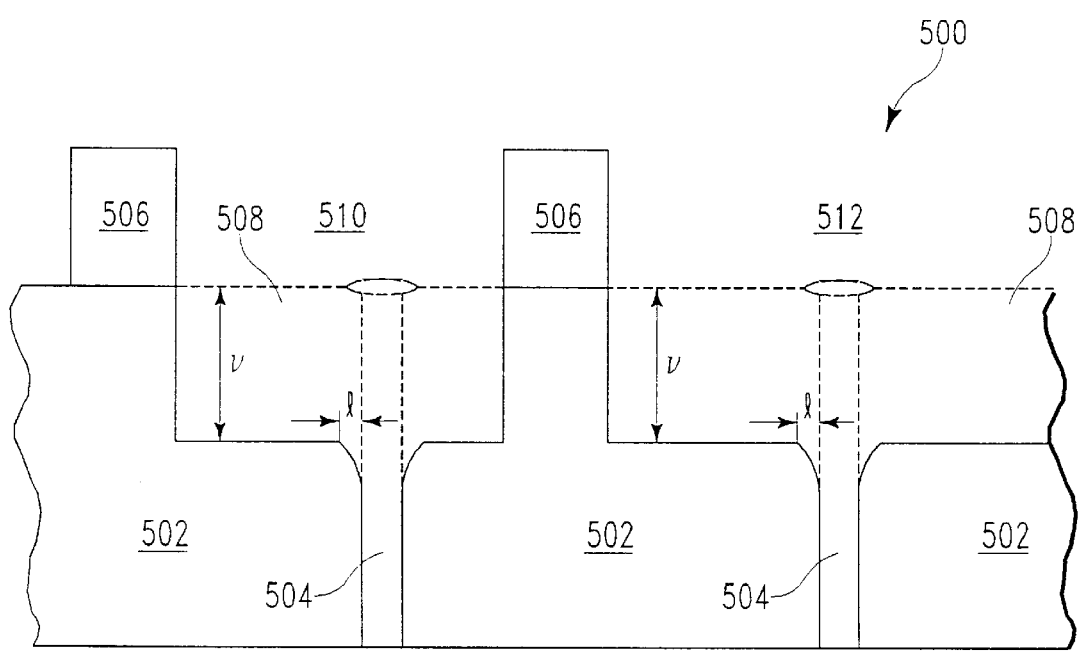
FIG. 5 is a schematic cross-sectional view of a dual damascene structure 500 which illustrates the ratio between lateral etching, l, and vertical etching, v, at the via hole 504 during etching of trench 508. This ratio, R, is referred to as the "facet ratio" or "etch loss ratio".

Referring to FIG. 5, the substrate used in the experiments described below was a 200 mm diameter silicon wafer (not shown) having a 1.2 $\mu$m thick layer of fluorinate-silicate glass (FSG) 502 deposited over its surface. The wafer was patterned using a 0.65 $\mu$m thick layer 506 of deep ultraviolet (DUV) photoresist over vias 504 already etched in the FSG 502. Dual damascene trenches 508 were then etched in the FSG layer 502 using the following processing conditions: 120 sccm $C_2F_6$; 200 sccm CO; 200 mTorr process chamber pressure; 1200 W substrate bias power; and 15° C. substrate temperature.

Copper lines typically underlie the silicon nitride etch stop layer at the bottom of the dual damascene via holes, which are exposed to the plasma during trench etching. If the silicon nitride layer is inadvertently etched during the trench etch step and the copper layer is exposed, severe metal sputtering may result. Therefore, a trench etch process with a high (i.e., at least 10:1) selectivity for etching oxide relative to silicon nitride, followed by a low power silicon nitride etch step to expose the copper lines, is highly desirable.

Scanning electron microscope (SEM) analysis of cross-sections of the wafer was used to measure etch rate, selectivity for etching oxide relative to a bottom silicon nitride etch stop layer, and etch rate loading between trench areas and open areas (indicated, respectively, by reference numerals 510 and 512 in FIG. 5). In the series of experiments discussed in this section, erosion of the bottom silicon nitride etch stop layer was negligible even after a 50% overetch step using a $C_4F_6/O_2/Ar$ mixture. Using a $C_2F_6$:CO (60:120) plasma, corner erosion was negligible after approximately 5000 Å of oxide had been etched.

Referring again to FIG. 5, the lateral etch rate of oxide from the sidewall of the via hole is indicated by l, while the vertical etch rate of oxide on the substrate surface is indicated by v. The ratio of l to v is referred to as the facet ratio or etch loss ratio (R). The ultimate goal of the process is to have R=0, that is, no critical dimension (CD) difference between pre- and post-plasma etching. However, since the dielectric etch process always results in a range of incident angles for ions and neutrals from the plasma, a 100% anisotropic etch is difficult to achieve, and a certain amount of erosion in both the vertical and lateral directions is inevitable.

Figure 6A:
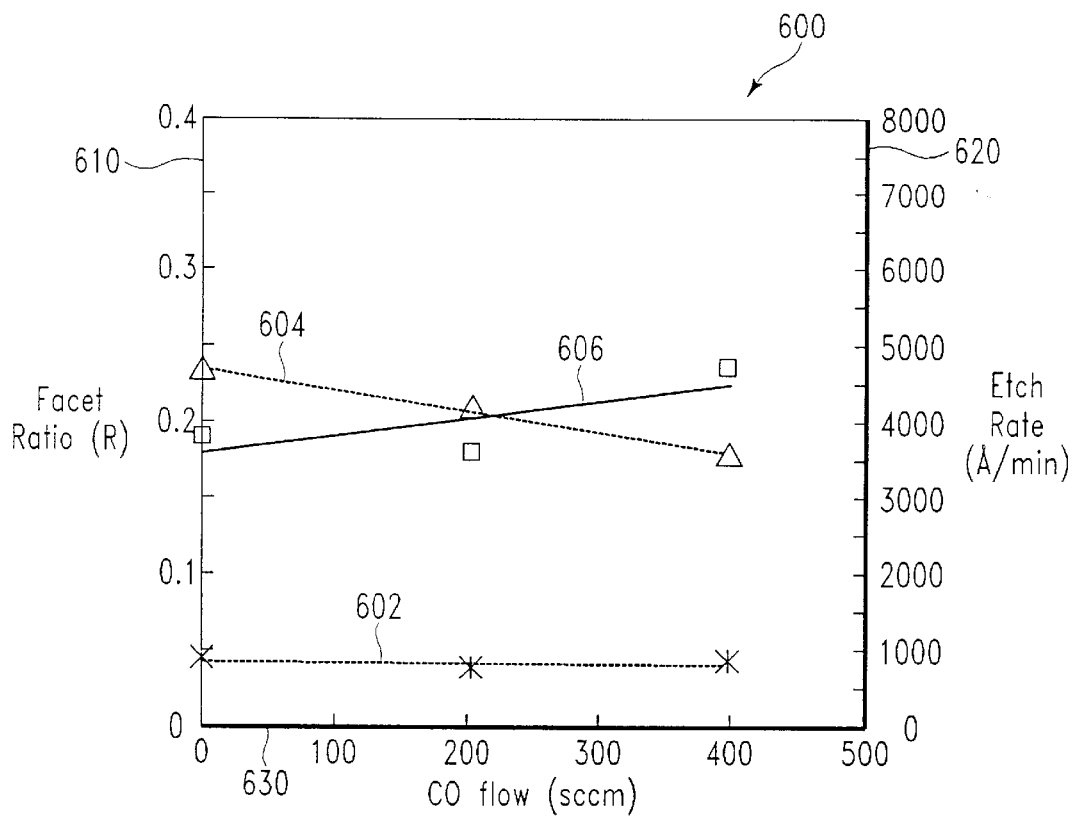
FIG. 6A is a graph 600 showing changes in the facet ratio 610 and oxide etch rate 620 as a function of the CO flow rate 630.
Figure 6B:
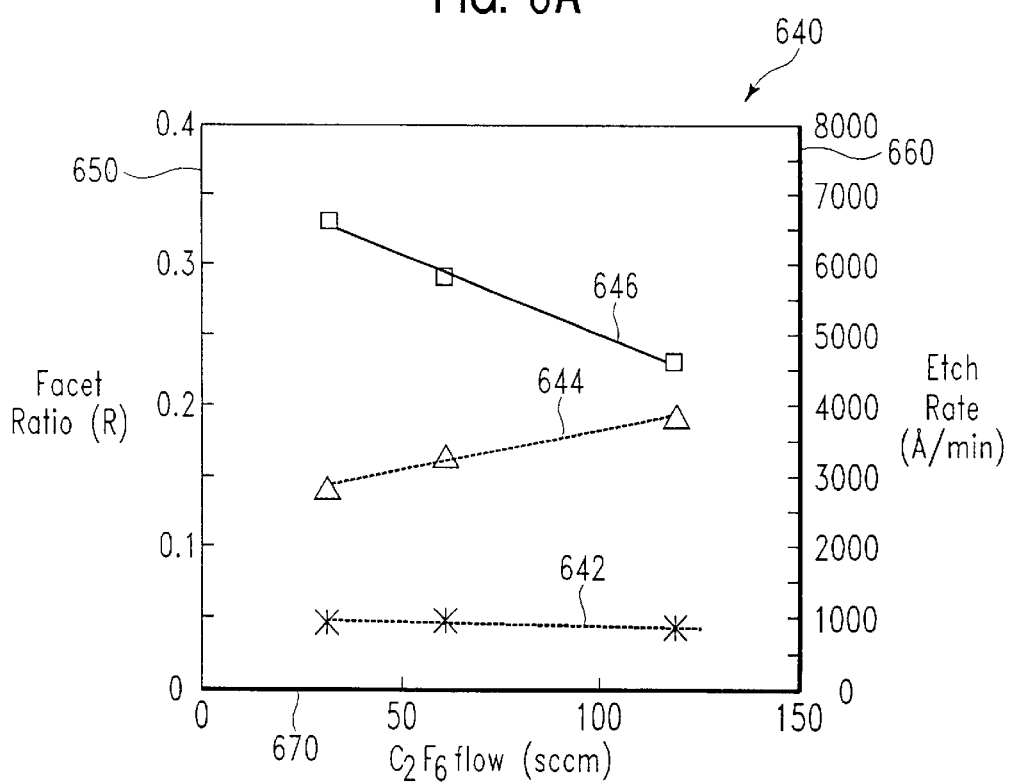
FIG. 6B is a graph 640 showing changes in the facet ratio 650 and oxide etch rate 660 as a function of the $C_2F_6$ flow rate 670.

Various processing conditions were investigated with the goal of minimizing the CD change for vias having sharp corners that were exposed to the plasma. FIG. 6A is a graph 600 showing changes in the facet ratio 610 and oxide etch rate 620 as a function of the CO flow rate 630. There are three plots on graph 600: plot 602 represents the lateral etch rate l, plot 604 represents the vertical etch rate v, and plot 606 represents the facet ratio (l/v). FIG. 6B is a graph 640 showing changes in the facet ratio 650 and oxide etch rate 660 as a function of the $C_2F_6$ flow rate 670. There are three plots on graph 640: plot 642 represents the lateral etch rate l, plot 644 represents the vertical etch rate v, and plot 646 represents the facet ratio (l/v).

Referring to FIG. 6A, facet ratio (R) increased gradually with increasing CO flow, with an accompanying significant change of the etched bottom shape in open areas of the wafer. An increase in the partial pressure of CO in a $C_xF_y$ plasma enhances the production of COF, which acts as a scavenger of free fluorine. This depletes the level of fluorine in the open areas, producing inferior etching conditions. Referring to FIG. 6B, increasing the $C_2F_6$ flow produced an opposite effect, because increasing the $C_2F_6$ content of the plasma inherently increases the amount of free fluorine in the plasma.

Figure 7:
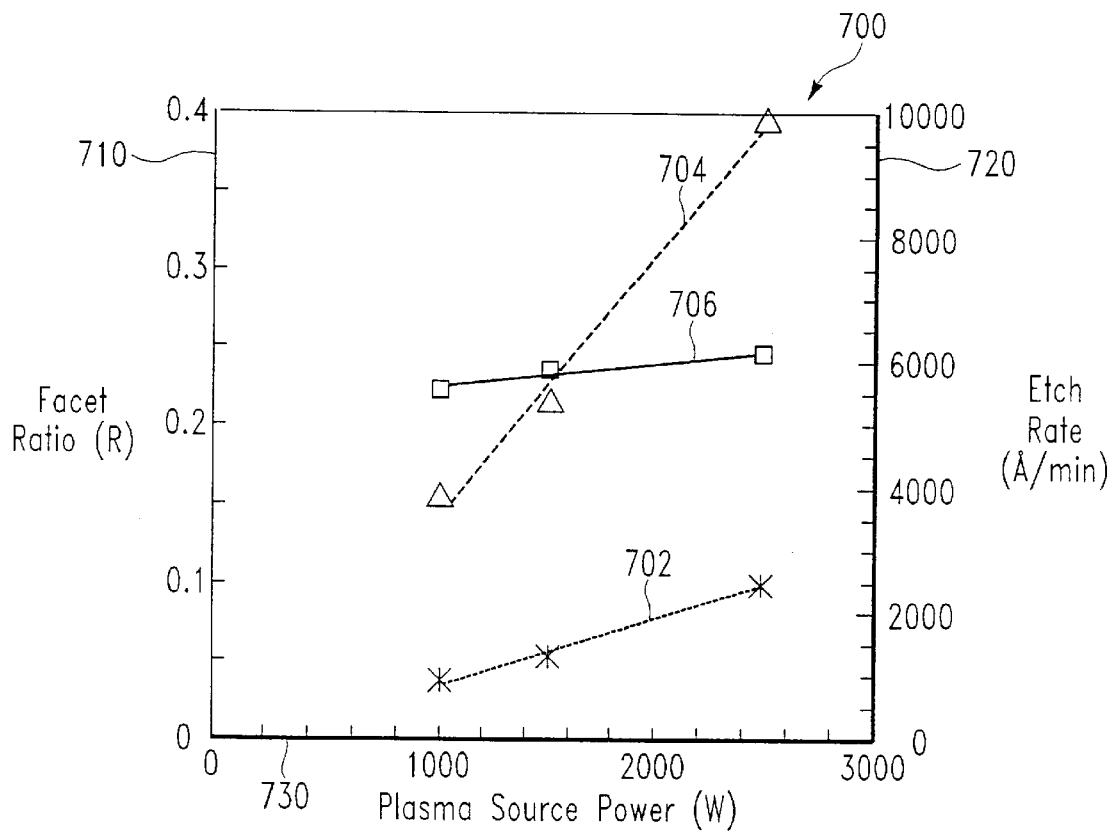
FIG. 7 is a graph 700 showing changes in the facet ratio 710 and oxide etch rate 720 as a function of the plasma source power 730 during trench etching.

FIG. 7 is a graph 700 showing changes in the facet ratio 710 and oxide etch rate 720 as a function of the plasma source power 730 during etching. There are three plots on graph 700: plot 702 represents the lateral etch rate l, plot 704 represents the vertical etch rate v, and plot 706 represents the facet ratio (l/v). Because both v and l increased with increasing RF power, the overall effect on facet ratio (R) was minor. Therefore, changes in the plasma source power during etching do not have as significant of an effect on R as do changes in the etch chemistry (as illustrated in FIGS. 6A and 6B).

Figure 8:
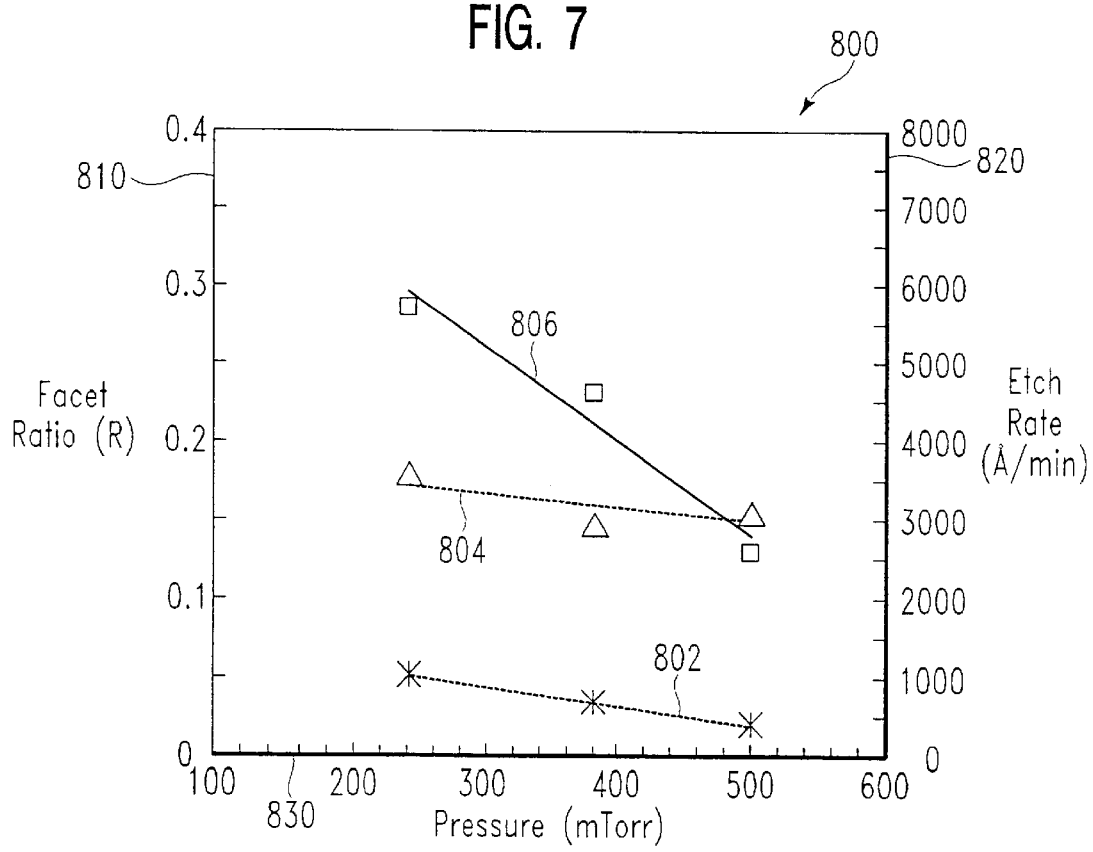
FIG. 8 is a graph 800 showing changes in the facet ratio 810 and oxide etch rate 820 as a function of the process chamber pressure 830 during trench etching.

FIG. 8 is a graph 800 showing changes in the facet ratio 810 and oxide etch rate 820 as a function of the process chamber pressure 830 during etching. There are three plots on graph 800: plot 802 represents the lateral etch rate l, plot 804 represents the vertical etch rate v, and plot 806 represents the facet ratio (l/v). Increasing the process chamber pressure significantly decreased the facet ratio (R). The decrease in R is primarily due to a decrease in l with increasing pressure, while v shows a gradual decrease with increasing pressure.

Figure 9A:
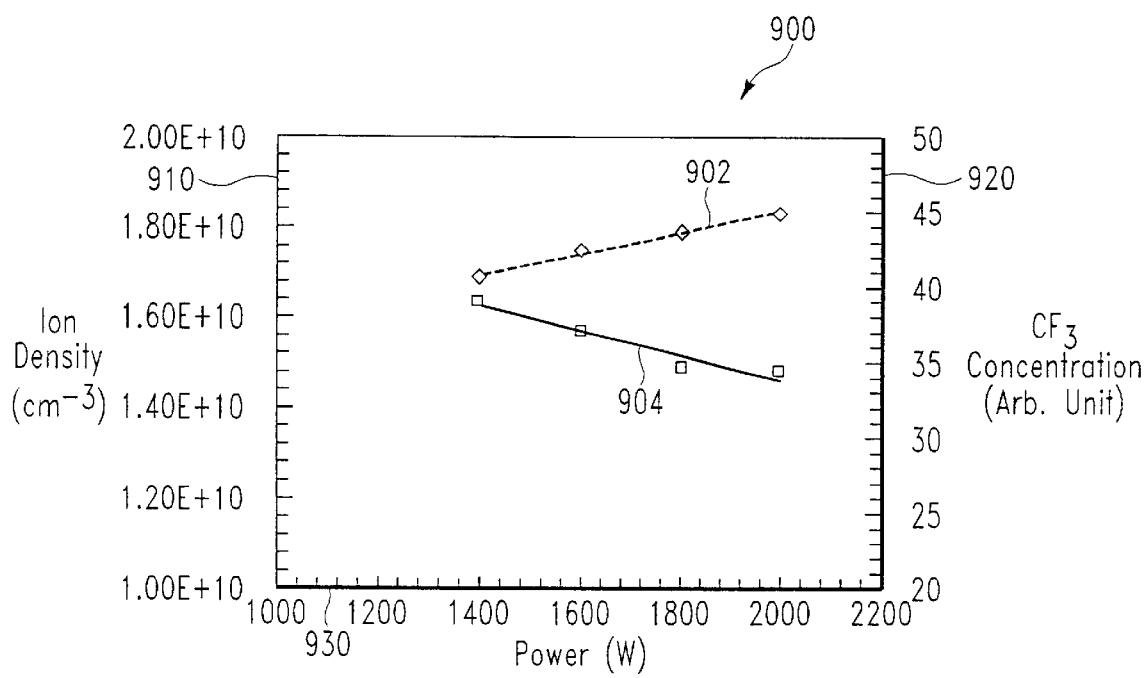
FIG. 9A is a graph 900 showing changes in the ion density 910 and the $CF_3$ concentration 920 of a $C_2F_6$/Ar MERIE plasma as a function of the plasma source power 930 during trench etching.
Figure 9B:
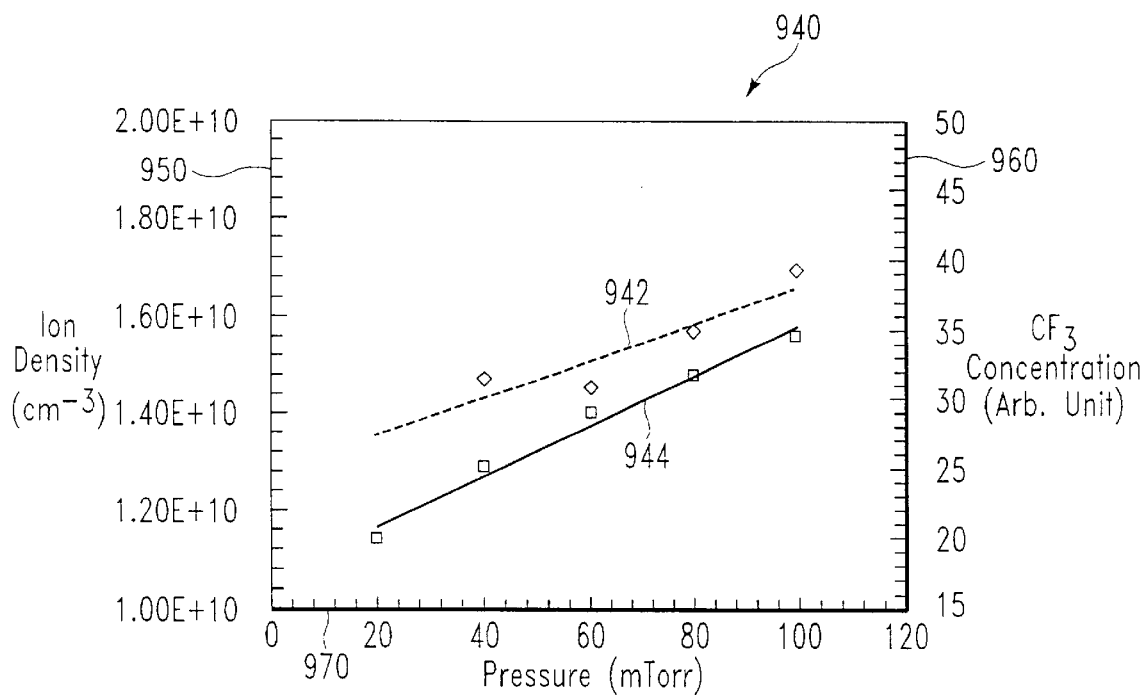
FIG. 9B is a graph 940 showing changes in the ion density 950 and the $CF_3$ concentration 960 of a $C_2F_6$/Ar MERIE plasma as a function of the process chamber pressure 970 during trench etching.

The major neutral species resulting from the dissociation of $C_2F_6$ gas is $CF_3$. FIG. 9A is a graph 900 showing changes in the ion density 910 and the $CF_3$ concentration 920 of a $C_2F_6$/Ar MERIE plasma as a function of the plasma source power 930 during etching. Ion density and plasma $CF_3$ concentration were measured approximately 1 cm above the wafer surface. Variations in the molecular density of $CF_3$ in the plasma were measured by 259–290 nm $CF_3$ band emission and 695 nm argon actinometry, and are presented in arbitrary units. There are two plots on graph 900: plot 902 represents the ion density and plot 904 represents the $CF_3$ concentration. FIG. 9B is a graph 940 showing changes in the ion density 950 and the $CF_3$ concentration 960 of a $C_2F_6$/Ar MERIE plasma as a function of the process chamber pressure 970 during etching. There are two plots on graph 940: plot 942 represents the ion density and plot 944 represents the $CF_3$ concentration.

Changes in both plasma source power and process chamber pressure produced an increase in the ion density of the plasma. However, as shown in FIGS. 7 and 8, respectively, changes in plasma source power had little effect on facet ratio (R), whereas an increase in the process chamber pressure produced a significant decrease in R. This indicates that the mechanism for anisotropic etching is not solely determined by the behavior of ions.

Increasing the plasma source power did not produce significant changes in the relative $CF_3$ density, whereas increasing the process chamber pressure resulted in a gradual increase in the relative $CF_3$ density, due to increased collisions of ions and neutrals with increased pressure.

The results shown in FIGS. 6–9 demonstrate that anisotropic etching of trench patterned oxide can be achieved at high process chamber pressures ($\geq$200 mTorr) using a $C_2F_6$ plasma in a MERIE reactor. The decrease in facet ratio (R)

at increased chamber pressures is due primarily to an increase in etch rate in the vertical direction (v) and, to a lesser extent, to a decrease in etch rate in the lateral direction (l). The variations in polymer deposition on feature surfaces and relative $CF_3$ concentration in the plasma were evaluated in order to obtain insight into the above results.

Figure 10A:
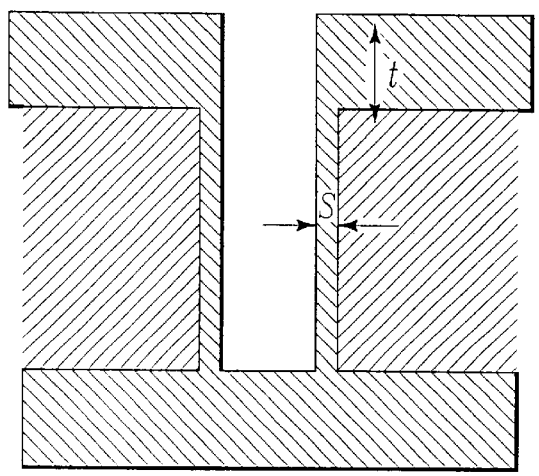
FIG. 10A shows the pattern of polymer byproduct deposition during trench etching. Polymers can deposit on either the top substrate surface t or on the bottom and sidewalls of the contact via s during etching.

Neutral species present in the plasma produce various polymer precursors during oxide etching. The types of neutral species generated is determined by the particular etch chemistry. As discussed above, the major neutral species resulting from the dissociation of $C_2F_6$ is $CF_3$, which is expected to deposit polymer in a manner similar to other fluorocarbon precursors. As shown in FIG. 10A, polymers can deposit on either the top substrate surface t or on the bottom and sidewalls of the contact via s during oxide etching using a fluorocarbon gas.

The competition between plasma etching and deposition of polymers on feature surfaces ultimately determines the final profile of the etched surface. The deposition of fluorocarbon polymers on feature surfaces has a significant effect on the mechanism of the oxide etch process. For example, the polymer may react with the oxide surface when ions impact the deposited polymer during plasma etching. Deposition of fluorine-rich polymers on the oxide surface could accelerate oxide etching, whereas deposition of carbon-rich polymers may inhibit etching. Thus, the depth of the etched feature is determined by both the deposition of polymers from $CF_3$ neutral precursors and the ion flux.

Figure 10B:
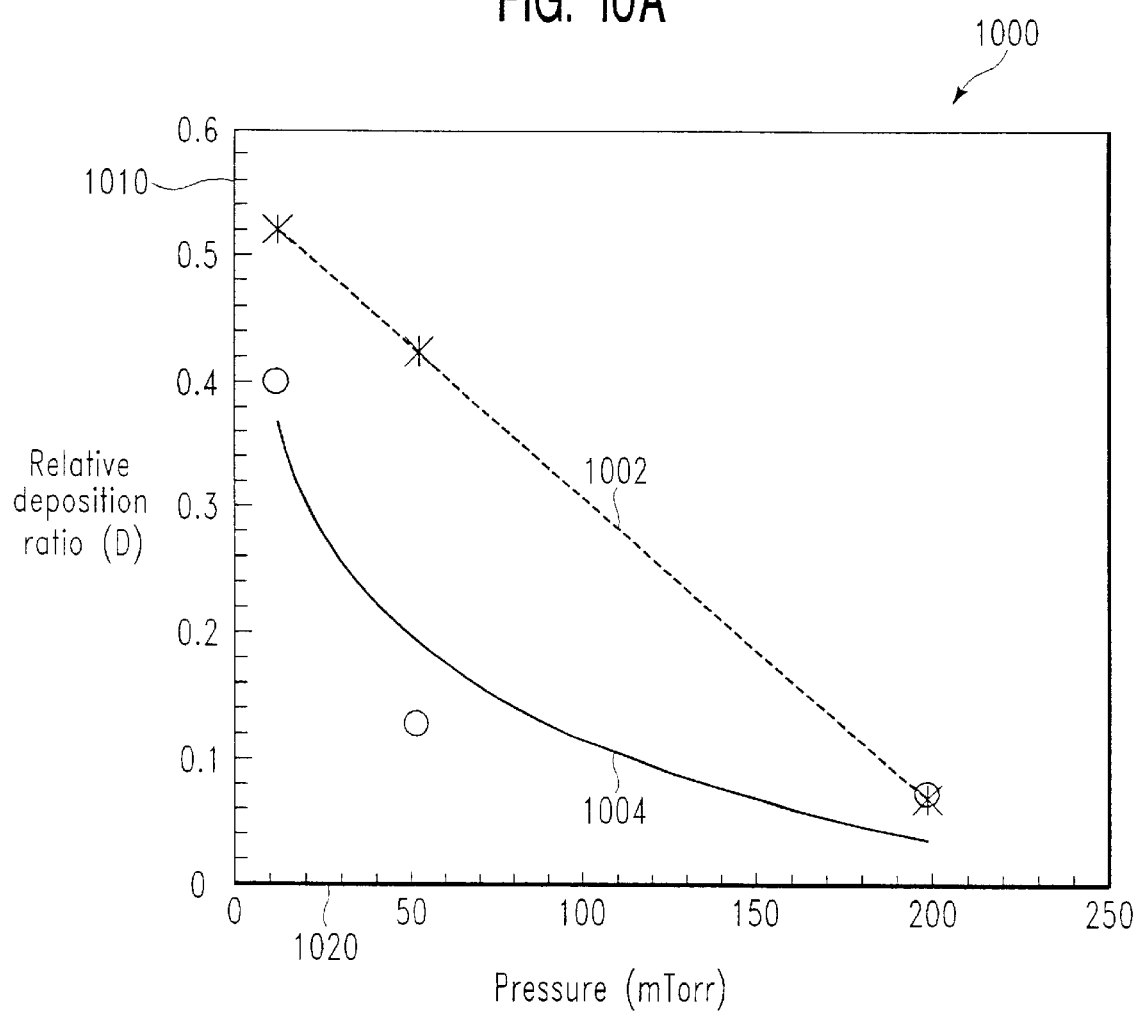
FIG. 10B is a graph 1000 showing changes in the relative polymer deposition ratio 1010 as a function of the process chamber pressure 1020 during trench etching.

FIG. 10B is a graph 1000 showing changes in the relative polymer deposition ratio 1010 as a function of the process chamber pressure 1020 during etching. There are two plots on graph 1000: plot 1002 represents deposition of polymer at the top of the contact via, and plot 1004 represents deposition of polymer at the bottom of the via. At a process chamber pressure of 200 mTorr, polymer deposition is concentrated primarily on the substrate surface at the top of the via, rather than inside the via hole. This corresponds to the behavior of neutrals from the plasma. As the pressure is increased above 50 mTorr, the flux of neutral species increases rapidly and the polymer deposition rate on the substrate surface increases gradually due to an increase in collisions between ions and neutrals. As a result of the increased collision rate at higher pressures, the ion flux delivered to the wafer can become isotropic, which can reduce the polymer deposition rate at the bottom of via holes and lead to thick deposition on the substrate surface. As the fluorine-rich polymer from the $C_2F_6$ plasma is deposited on the oxide surface, open areas of the substrate would have both neutrals and ions coming from the high pressure plasma to impinge on the surface. This effect can be reversed by reducing the isotropic flux of neutral species, i.e., by decreasing the pressure. As shown in FIG. 10B, at reduced pressure, polymer is deposited conformally on both the substrate surface and the bottom of the via hole. In open areas or in low aspect ratio features, neutral species easily reach the bottom of via holes, where they form polymer deposits. In high aspect ratio features, these isotropic polymer precursors form thicker deposits near the entrance to the features. However, the isotropic depositing flux is reduced at the bottom of high aspect ratio features.

Figure 11:
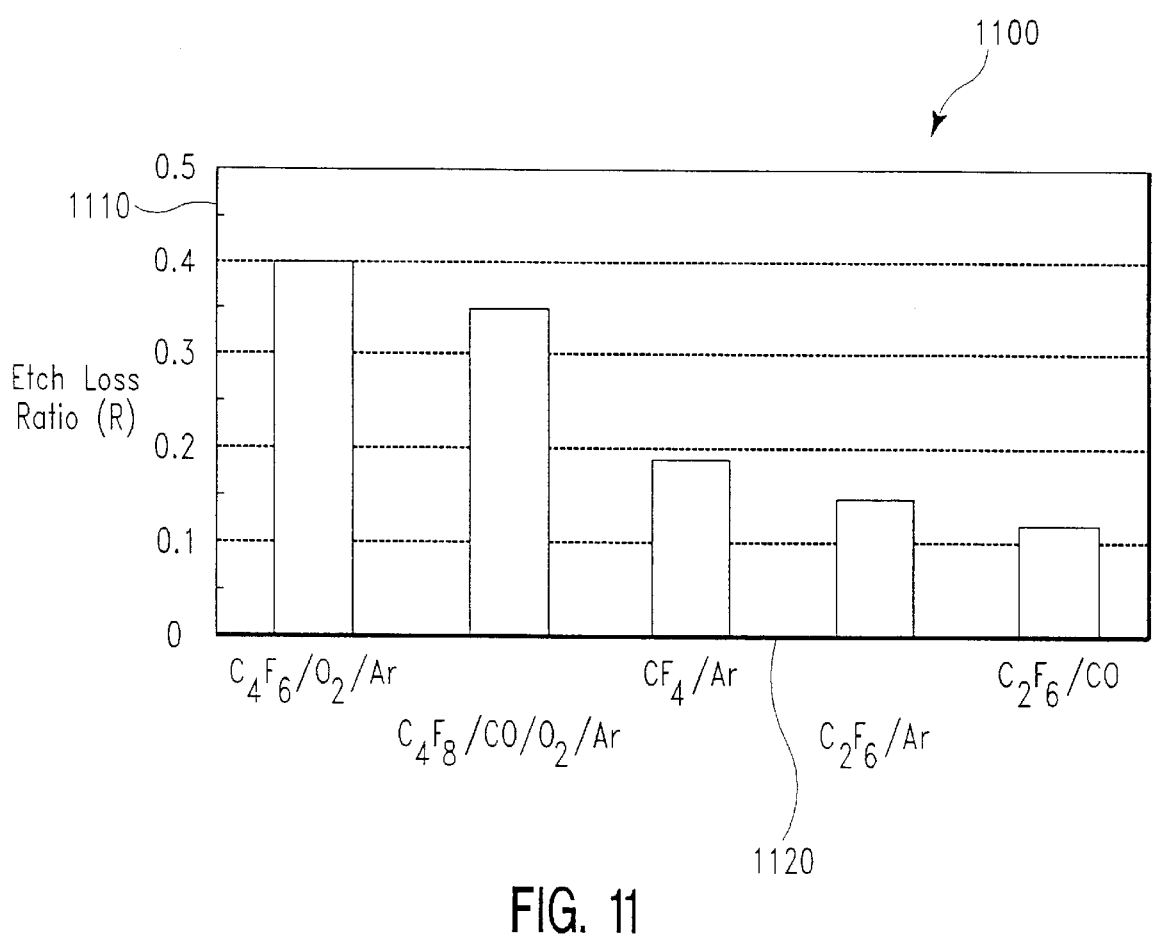
FIG. 11 is a graph 1100 showing changes in etch loss (i.e., facet) ratio (R) as a function of etch chemistry.

FIG. 11 is a graph 1100 showing changes in etch loss (i.e., facet) ratio (R) as a function of etch chemistry. The facet ratio generally decreased with increases in the fluorine to carbon ratio in the fluorocarbon gas. As discussed above, the particular etch chemistry determines the types of neutral species generated, which in turn determine the types of polymers deposited on feature surfaces, during the oxide etch process. As shown in FIG. 11, the relatively carbon-rich $C_4F_6/O_2/Ar$ (F:C ratio of 1.5:1) and $C_4F_8/O_2/Ar$ (F:C ratio of 2:1) etch chemistries resulted in unacceptable R values of on the order of 0.3–0.4, whereas the relatively fluorine-rich $CF_4/Ar$ (F:C ratio of 4:1), $C_2F_6/Ar$ (F:C ratio of 3:1), and $C_2F_6/CO$ (F:C ratio of 3:1) resulted in lower (<0.2) R values.

The above described preferred embodiments are not intended to limit the scope of the present invention, as one skilled in the art can, in view of the present disclosure expand such embodiments to correspond with the subject matter of the invention claimed below.

We claim:

1. A method of etching a trench overlying a contact via in a silicon-containing low k dielectric material, in the absence of a trench etch stop layer, comprising:
    a) exposing said silicon-containing low k dielectric material to a plasma generated from a source gas comprising a fluorine-containing etchant gas and an additive gas selected from the group consisting of carbon monoxide (CO), an inert gas, and combinations thereof, wherein a volumetric flow ratio of said additive gas to said fluorine-containing etchant gas is within the range of about 1.25:1 to about 20:1, and wherein said fluorine-containing etchant gas is selected from the group consisting of a fluorocarbon gas having a fluorine:carbon ratio of at least 3:1, $SF_6$, $NF_3$, and combinations thereof; and
    b) etching said trench in said silicon-containing low k dielectric material to a nominal trench depth in the absence of a trench etch stop layer.

2. The method of claim 1, wherein said volumetric flow ratio of said additive gas to said fluorine-containing etchant gas is within the range of about 2.5:1 to about 20:1.

3. The method of claim 1, wherein said inert gas is selected from the group consisting of argon, neon, krypton, and combinations thereof.

4. The method of claim 1, wherein said silicon-containing low k dielectric material is selected from the group consisting of a fluorinate-silicate glass (FSG) and an organosilicate glass (OSG).

5. The method of claim 4, wherein said low k dielectric material is an organosilicate glass, and wherein said source gas further includes $N_2$.

6. The method of claim 5, wherein a volumetric flow ratio of said fluorine-containing etchant gas to said $N_2$ is within the range of about 3:1 to about 1:1.

7. The method of claim 1, wherein a volumetric flow ratio of said additive gas to said fluorocarbon gas is within the range of about 2.5:1 to about 5:1.

8. The method of claim 1, wherein said fluorocarbon gas is selected from the group consisting of $CF_4$, $C_2F_6$, and combinations thereof.

9. The method of claim 1, wherein said fluorine-containing etchant gas is $SF_6$, said additive gas includes CO, and wherein a volumetric flow ratio of said additive gas to said $SF_6$ is within the range of about 2.5:1 to about 5:1.

10. The method of claim 1, wherein said fluorine-containing etchant gas is $NF_3$, said additive gas includes CO, and wherein a volumetric flow ratio of said additive gas to said $NF_3$ is within the range of about 2.5:1 to about 5:1.

11. The method of claim 1, wherein said plasma has an ion density within the range of about $10_9$ $e^-/cm^3$ to about $10_{10}$ $e^-/cm^3$.

12. The method of claim 11, wherein said method is performed in a capacitively coupled, parallel plate reactor at a process chamber pressure within the range of about 200 mTorr to about 500 mTorr.

13. The method of claim 1, wherein said method is performed at a substrate temperature within the range of about 15° C. to about 40° C.

14. A method of etching a trench overlying a contact via in a continuous layer of a silicon-containing low k dielectric material, which is absent an etch stop layer, comprising: exposing said low k dielectric material to a plasma generated from a source gas consisting essentially of a fluorine-containing etchant gas selected from the group consisting of a fluorocarbon gas having a fluorine to carbon ratio of at about 3:1, $SF_6$, $NF_3$, and combinations thereof; and an additive gas selected from the group consisting of carbon monoxide (CO), an inert gas, and combinations thereof.

15. The method of claim 14, wherein said inert gas is selected from the group consisting of argon, neon, krypton, and combinations thereof.

16. The method of claim 14, wherein said silicon-containing low k dielectric material is selected from the group consisting of a fluorinate-silicate glass (FSG) and an organosilicate glass (OSG).

17. The method of claim 14, wherein said source gas consists essentially of a fluorocarbon gas having a fluorine: carbon ratio of at least about 3:1, and an additive gas selected from the group consisting of carbon monoxide (CO), argon, and combinations thereof.

18. The method of claim 17, wherein said fluorocarbon gas is selected from the group consisting of $CF_4$, $C_2F_6$, and combinations thereof.

19. The method of claim 17, wherein a volumetric flow ratio of said additive gas to said fluorocarbon gas is within the range of about 2.5:1 to about 5:1.

20. The method of claim 14, wherein said plasma has an ion density within the range of about $10_9$ $e^-/cm^3$ to about $10_{10}$ $e^-cm^3$.

21. The method of claim 20, wherein said method is performed in a capacitively coupled, parallel plate reactor at a process chamber pressure within the range of about 200 mTorr to about 500 mTorr.

22. The method of claim 14, wherein said method is performed at a substrate temperature within the range of about 15° C. to about 40° C.

23. A method of etching a trench overlying a contact via in a continuous layer of an organosilicate glass, which is absent an etch stop layer, comprising: exposing said organosilicate glass to a plasma generated from a source gas consisting essentially of a fluorocarbon gas having a fluorine to carbon ratio of at least 3:1; an additive gas selected from the group consisting of carbon monoxide (CO), an inert gas, and combinations thereof; and $N_2$.

24. The method of claim 23, wherein a volumetric flow ratio of said fluorocarbon to said $N_2$ is within the range of about 3:1 to about 1:1.

25. A method of forming a vertical interconnect in a semiconductor structure, comprising:
a) providing a first patterned photoresist layer overlying a continuous layer of a silicon-containing dielectric material which is absent an intermediate etch stop layer, said dielectric material having a dielectric constant of about 4 or less, where the silicon-containing dielectric layer overlies a metallic interconnect layer;
b) pattern etching a vertical opening to a first nominal depth in said silicon-containing dielectric layer;
c) removing said first photoresist layer;
d) applying a protective conformal layer over said semiconductor structure, including the surfaces of said vertical opening;
e) forming a second patterned photoresist layer over an upper, field surface of said semiconductor structure and in contact with said conformal coating which is present on said upper surface; and
f) pattern etching a trench to a second nominal depth in said silicon-containing dielectric layer using a plasma generated from a source gas consisting essentially of a fluorine-containing etchant gas and an additive gas selected from the group consisting of carbon monoxide (CO), inert gas, and combinations thereof, wherein a volumetric flow ratio of said additive gas to said fluorine-containing etchant gas is within the range of about 1.25:1 to about 20:1, and wherein said fluorine-containing etchant gas is selected from the group consisting of a fluorocarbon gas having a fluorine: carbon ratio of at least about 3:1, $SF_6$, $NF_3$, and combinations thereof.

26. The method of claim 25, wherein said volumetric flow ratio of said additive gas to said fluorine-containing etchant gas is within the range of about 2.5:1 to about 20:1.

27. The method of claim 25, wherein said semiconductor structure further comprises a bottom etch stop layer between said silicon-containing dielectric layer and said metallic interconnect layer, and wherein an upper surface of said bottom etch stop layer is exposed during etching of said vertical opening.

28. The method of claim 27, wherein said bottom etch stop layer comprises a material selected from the group consisting of silicon nitride, silicon carbide, and silicon carbide nitride.

29. The method of claim 26 or claim 27, or claim 28, wherein said protective conformal layer is removed from said upper field surface of said semiconductor substrate during etching of said trench.

30. The method of claim 29, wherein said protective layer comprises an antireflective coating (ARC) material.

31. The method of claim 30, wherein said ARC material is an organic ARC material.

32. The method of claim 25, wherein said metallic interconnect layer comprises copper.

33. The method of claim 25, wherein said silicon-containing dielectric material is silicon oxide.

34. The method of claim 25, wherein said silicon-containing dielectric material is a low k dielectric material.

35. The method of claim 34, wherein said low k dielectric material is selected from the group consisting of a fluorinate-silicate glass (FSG) and an organosilicate glass (OSG).

36. The method of claim 35, wherein said low k dielectric material is an organosilicate glass, and wherein $N_2$ is added to said source gas.

37. The method of claim 36, wherein a volumetric flow ratio of said fluorocarbon to said $N_2$ is within the range of about 3:1 to about 1:1.

38. The method of claim 29, wherein said fluorine-containing containing etchant gas is a fluorocarbon gas having a fluorine:carbon ratio of at least about 3:1, and wherein a volumetric flow ratio of said additive gas to said fluorocarbon gas is within the range of about 2.5:1 to about 5:1.

39. The method of claim 38, wherein said fluorocarbon gas is selected from the group consisting of $CF_4$, $C_2F_6$, and combinations thereof.

40. The method of claim 25, wherein said fluorine-containing etchant gas is $SF_6$, said additive gas includes CO, and wherein a volumetric flow ratio of said additive gas to said $SF_6$ is within the range of about 2.5:1 to about 5:1.

41. The method of claim 25, wherein said fluorine-containing etchant gas is $NF_3$, said additive gas includes CO, and wherein a volumetric flow ratio of said additive gas to said $NF_3$ is within the range of about 2.5:1 to about 5:1.

42. The method of claim 25, wherein said plasma has an ion density within the range of about $10^9$ $e^-/cm^3$ to about $10_{10}$ $e^-/cm^3$.

43. The method of claim 42, wherein pattern etching of said trench is performed capacitively coupled, parallel plate reactor at a process chamber pressure within the range of about 200 mTorr to about 500 mTorr.

44. The method of claim 25, wherein pattern etching of said trench is performed at a substrate temperature within the range of about 15° C. to about 40° C.

45. The method of claim 25, wherein said inert gas is selected from the group consisting of argon, neon, xenon, and combinations thereof.

46. The method of claim 45, wherein said inert gas is argon.

* * * * *